United States Patent
Dong et al.

(10) Patent No.: US 9,886,538 B1
(45) Date of Patent: Feb. 6, 2018

(54) SYSTEM AND METHOD FOR USING HETEROGENEOUS HIERARCHICAL CONFIGURATIONS FOR ELECTRONIC DESIGN REUSE

(71) Applicant: Cadence Design Systems, Inc., San Jose, CA (US)

(72) Inventors: Xianghui Dong, Beijing (CN); Chandrashekar Lakshminarayanan Chetput, San Jose, CA (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 15/207,798

(22) Filed: Jul. 12, 2016

(51) Int. Cl.
G06F 17/50 (2006.01)

(52) U.S. Cl.
CPC ...... *G06F 17/5045* (2013.01); *G06F 17/5036* (2013.01); *G06F 17/5063* (2013.01)

(58) Field of Classification Search
CPC ............ G06F 17/5045; G06F 17/5036; G06F 17/5063
See application file for complete search history.

(56) References Cited

U.S. PATENT DOCUMENTS

| | | | | |
|---|---|---|---|---|
| 6,813,597 | B1* | 11/2004 | Demler | G06F 17/5063 703/14 |
| 7,493,574 | B2* | 2/2009 | Liu | G06F 17/5036 716/132 |
| 7,761,279 | B1* | 7/2010 | Cai | G06F 17/5036 703/14 |
| 7,836,419 | B1* | 11/2010 | McGaughy | G06F 17/5036 703/14 |
| 7,971,178 | B1* | 6/2011 | Marwah | G06F 17/5045 716/100 |
| 8,296,717 | B1* | 10/2012 | O'Riordan | G06F 17/5077 716/126 |
| 8,407,635 | B2* | 3/2013 | Chopra | G06F 17/504 703/16 |
| 8,448,116 | B2* | 5/2013 | Chetput | G06F 17/5018 716/101 |
| 9,280,621 | B1* | 3/2016 | Ginetti | G06F 17/5022 |
| 2013/0144589 | A1* | 6/2013 | Levi | G06F 17/5022 703/14 |

* cited by examiner

*Primary Examiner* — Naum B Levin
(74) *Attorney, Agent, or Firm* — Mark H. Whittenberger, Esq.; Holland & Knight LLP

(57) ABSTRACT

The present disclosure relates to a computer-implemented method for electronic design configuration reuse. The process may include providing an electronic design having one or more mixed signal configurations. The process may further include storing at least one digital configuration and at least one analog configuration at an electronic design database. The process may further include allowing the one or more mixed signal configurations to access the at least one digital configuration or the at least one analog configuration from the electronic design database.

17 Claims, 13 Drawing Sheets

600

700

SYSTEM AND METHOD FOR USING HETEROGENEOUS HIERARCHICAL CONFIGURATIONS FOR ELECTRONIC DESIGN REUSE

FIELD OF THE INVENTION

The present disclosure relates to electronic design automation, and more specifically, to a system and method for using heterogeneous hierarchical configurations for design reuse.

DISCUSSION OF THE RELATED ART

Electronic design automation (EDA) utilizes software tools that may be used in the design and analysis of numerous electronic systems such as printed circuit boards (PCBs) and integrated circuits (ICs). A configuration reuse may be used as an input at the start of the Design Process, which may specify all of the logical and physical parts on the design.

Electronic design verification techniques may be used to verify as much as needed to sign off on verification closure metrics before a chip is sent to tape-out. With the growing mix of analog and digital blocks in the same chip or system, verification is increasingly requiring mixed-signal verification. Mixed signal verification requires trade-offs between speed (e.g., digital) and accuracy (e.g., analog). The same device could be modeled at different levels of abstraction, for example, logic (e.g., Verilog, VHSIC Hardware Description Language "VHDL", SystemVerilog), real number modeling (e.g., Verilog-AMS, VHDL, SystemVerilog), mixed signal behavioral modeling (e.g., Verilog-Analog/Mixed Signal "AMS", VHDL-AMS), analog behavioral modeling (e.g., Verilog-A), analog devices (e.g., Simulation Program with Integrated Circuit Emphasis "SPICE" and its variants), etc. This leads to the creation of configurations to manage different models of the same circuit to address verification goals.

Because of the timing constraints inherent in verification projects, and in EDA in general, IP reuse is becoming increasingly more common in today's semiconductor industry. For single product IP reuse flow, design and verification are divided into several groups with each group responsible for one block. After verification, each block could be integrated into the top level design unit. Configuration of each block should be reusable in top level run. For AMS IP reuse, things are more complex. Typically, there are two groups, a digital centric designer and an analog centric designer. Digital design may use one configuration (e.g., Verilog 2001) while analog designs are generated from another (e.g., netlister). For example, an EDA netlister may also generate a proprietary/intermediate configuration file (e.g., Bind2) to configure text (which is either already imported into an EDA application as a white box design unit or maintained outside of the as a black box design unit) and analog schematics based on user's settings through a Hierarchy Editor ("HED").

SUMMARY

In one or more embodiments of the present disclosure, a computer-implemented method for electronic design configuration reuse is provided. The method may include providing an electronic design having one or more mixed signal configurations. The method may further include storing at least one digital configuration and at least one analog configuration at an electronic design database. The method may further include allowing the one or more mixed signal configurations to access the at least one digital configuration or the at least one analog configuration from the electronic design database.

One or more of the following features may be included. In some embodiments, the at least one digital configuration may include one or more of a Verilog configuration, VHDL configuration, and a SystemVerilog configuration. The method may further include receiving, via the at least one processor, a user-generated label and applying the user-generated label to the one or more mixed signal configurations. The method may further include providing a digital-on-top user with access to the one or more mixed signal configurations and allowing a simulation using the one or more mixed signal configurations. The method may further include providing an analog-on-top user with access to the at least one digital configuration and allowing a simulation using the at least one digital configuration. In some embodiments, the at least one digital configuration may be used as a top-level design or testbench. The method may also include allowing an analog-on-top user to configure a plurality of different instances of a digital cell or block to a different digital configuration within the electronic design.

In some embodiments, a computer-readable storage medium having stored thereon instructions that when executed by a machine result in one or more operations is provided. Operations may include providing an electronic design having one or more mixed signal configurations. Operations may further include storing at least one digital configuration and at least one analog configuration at an electronic design database. Operations may further include allowing the one or more mixed signal configurations to access the at least one digital configuration or the at least one analog configuration from the electronic design database.

One or more of the following features may be included. In some embodiments, the at least one digital configuration may include one or more of a Verilog configuration, VHDL configuration, and a SystemVerilog configuration. Operations may further include receiving, via the at least one processor, a user-generated label and applying the user-generated label to the one or more mixed signal configurations. Operations may further include providing a digital-on-top user with access to the one or more mixed signal configurations and allowing a simulation using the one or more mixed signal configurations. Operations may further include providing an analog-on-top user with access to the at least one digital configuration and allowing a simulation using the at least one digital configuration. In some embodiments, the at least one digital configuration may be used as a top-level design or testbench. Operations may also include allowing an analog-on-top user to configure a plurality of different instances of a digital cell or block to a different digital configuration within the electronic design.

In one or more embodiments of the present disclosure, a system is provided. The system may include a computing device having at least one processor configured to provide and/or receive an electronic design having one or more mixed signal configurations. The computing device may be configured to store at least one digital configuration and at least one analog configuration at an electronic design database. The at least one processor may be configured to allow the one or more mixed signal configurations to access the at least one digital configuration or the at least one analog configuration from the electronic design database.

One or more of the following features may be included. In some embodiments, the at least one digital configuration may include one or more of a Verilog configuration, VHDL configuration, and a SystemVerilog configuration. The at least one processor may be configured to receive a user-generated label and applying the user-generated label to the one or more mixed signal configurations. The at least one processor may be configured to provide a digital-on-top user with access to the one or more mixed signal configurations and allow a simulation using the one or more mixed signal configurations. The at least one processor may be configured to provide an analog-on-top user with access to the at least one digital configuration and allowing a simulation using the at least one digital configuration. In some embodiments, the at least one digital configuration may be used as a top-level design or testbench. The at least one processor may be configured to allow an analog-on-top user to configure a plurality of different instances of a digital cell or block to a different digital configuration within the electronic design.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
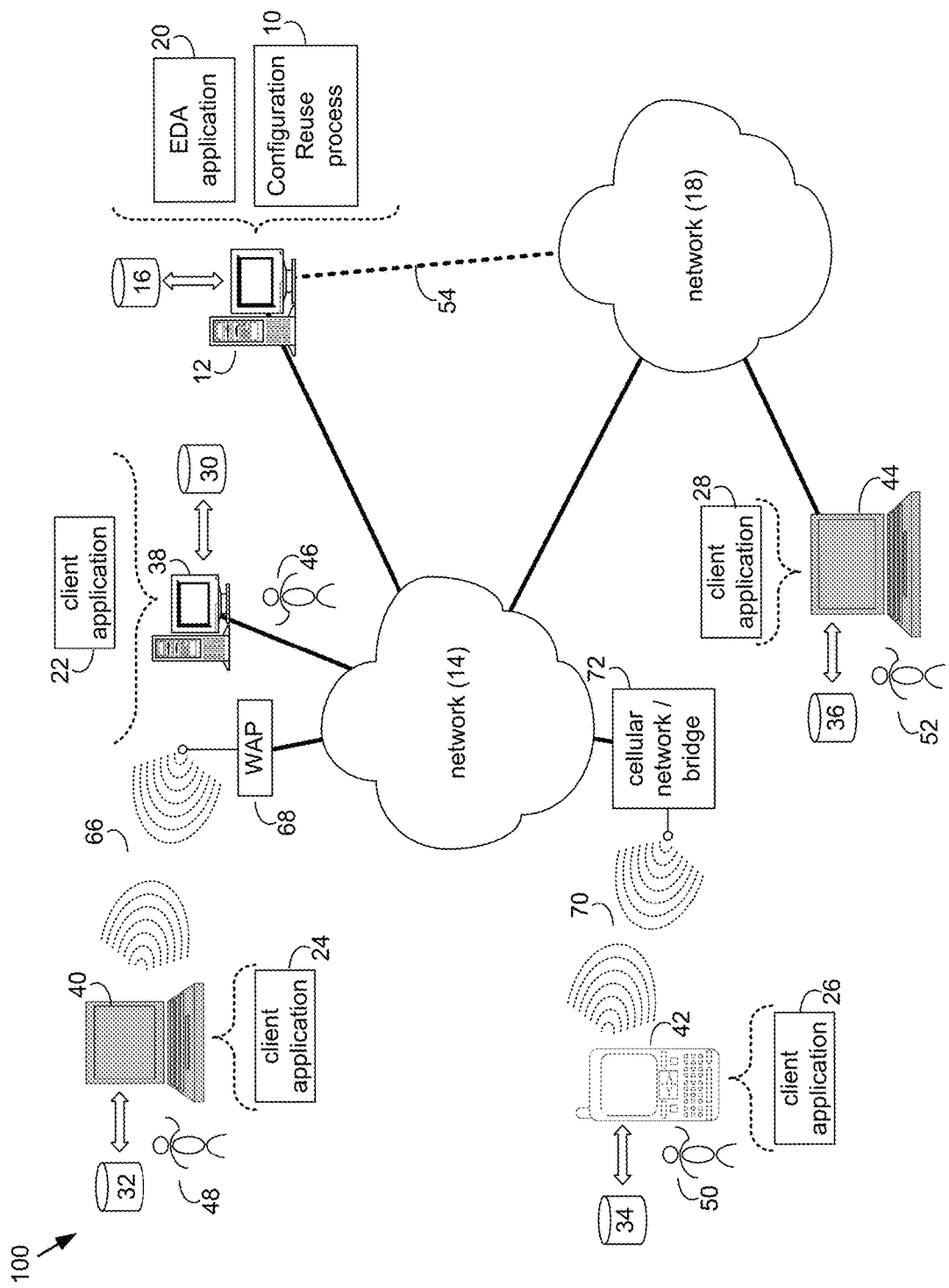
FIG. 1 is a system diagram depicting aspects of the configuration reuse process in accordance with an embodiment of the present disclosure.

Embodiments of the present disclosure are directed towards a system and method for seamless IP reuse of digital blocks (e.g., that may be created in a digital-centric command-line flow) and analog blocks (e.g., that may be created in an analog-centric flow). These may be provided in a user's preferred (e.g., analog or digital) environment for efficient mixed signal verification.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Referring to FIG. 1, a number of processes that may reside on and may be executed by server computer 12, which may be connected to network 14 (e.g., the Internet or a local area network) are provided. Embodiments of the present disclosure are directed towards a configuration reuse process 10, configuration process 11, and key performance indicator process 13, each of which is discussed in further detail hereinbelow. Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the processes described herein may reside on and be executed, in whole or in part, by a client electronic device, such as a personal computer, notebook computer, personal digital assistant, or the like.

The instruction sets and subroutines of processes 10, 11, and 13, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language ("HDL") files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Each of processes 10, 11, and 13 may be a stand alone application, or may be an applet/application/script that may interact with and/or be executed within EDA application 20. In addition/as an alternative to being a server-side process, the processes 10, 11, and 13 may be a client-side process (not shown) that may reside on a client electronic device (described below) and may interact with an EDA client application (e.g., one or more of EDA client applications 22, 24, 26, 28). Further, the processes 10, 11, and 13 may be a hybrid server-side/client-side process that may interact with EDA application 20 and an EDA client application (e.g., one or more of client applications 22, 24, 26, 28). As such, the processes 10, 11, and 13 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize processes 10, 11, and 13.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
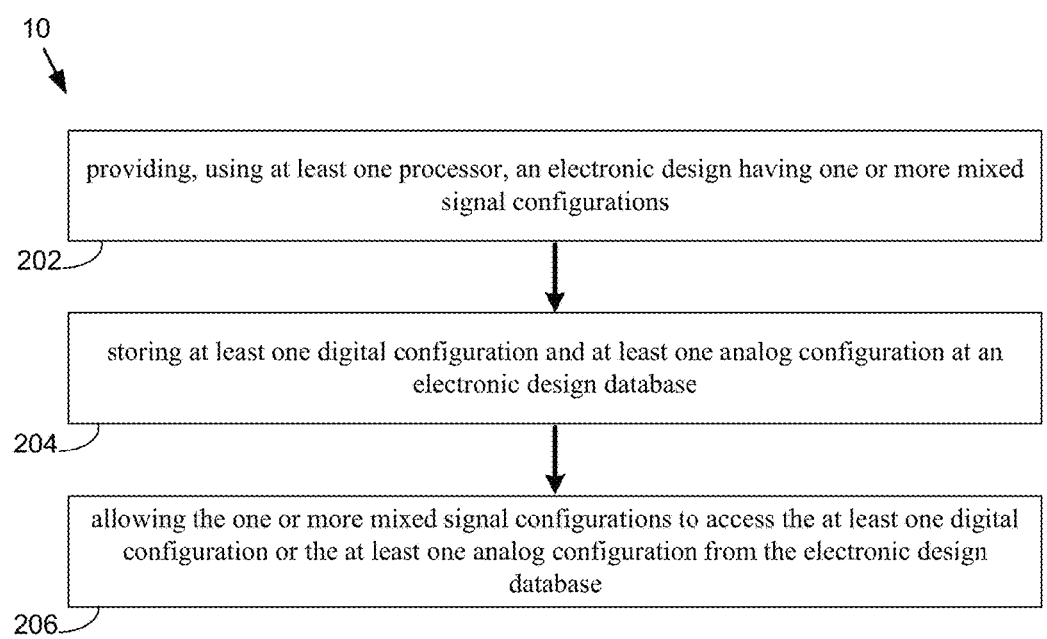
FIG. 2 is a flowchart depicting operations consistent with the configuration reuse process of the present disclosure.

Referring now to FIG. 2, an embodiment of configuration reuse process 10 is provided. The process may include providing (202), using at least one processor, an electronic design having one or more mixed signal configurations. The process may further include storing (204) at least one digital configuration and at least one analog configuration at an electronic design database. The process may further include allowing (206) the one or more mixed signal configurations to access the at least one digital configuration or the at least one analog configuration from the electronic design database.

The term "configuration" as used herein may refer to a set of rules which specify how a design is constructed for simulation. If all device/circuit names are unique in a design then the need for a configuration may be minimized or eliminated. Some tools try to avoid the need for configuration by adjusting the names to make them unique. Such approaches do not scale when IP or blocks are created that need to be reused in either a larger block or simply leveraged at a later time in evolving designs. Adjusting names may also cause other challenges to debug as the original name in the start of the design flow may change as the design works through various tools in the flow and, as such, may be difficult to trace. Accordingly, embodiments of the present disclosure may provide scalable, manageable configurations. Analog, mixed-signal, and digital configurations are all discussed below in further detail.

Analog blocks are typically smaller in size and the device names are managed to be unique. Technology specific names may be managed in other ways like sections. Digital blocks may be large and may have many different ways of specifying configurations over the years (e.g., HDL configurations). Some examples may include, but are not limited to, Verilog-XL configuration available from the Assignee of the present disclosure, VHDL configuration, and Verilog/SystemVerilog configuration.

Some platforms such as the Virtuoso platform available from the Assignee of the present disclosure may manage configurations as well. Mixed signal configurations may manage the integration of analog and digital blocks for simulation.

In pure digital designs, HDL configurations may be used. HDL configurations have standard specifications for reuse via hierarchical configurations. In analog and mixed signal designs (e.g. those created using those available from the Assignee of the subject application), EDA application specific configurations are used. Some EDA application configurations have proprietary specifications for reuse via hierarchical configurations.

Figure 3:
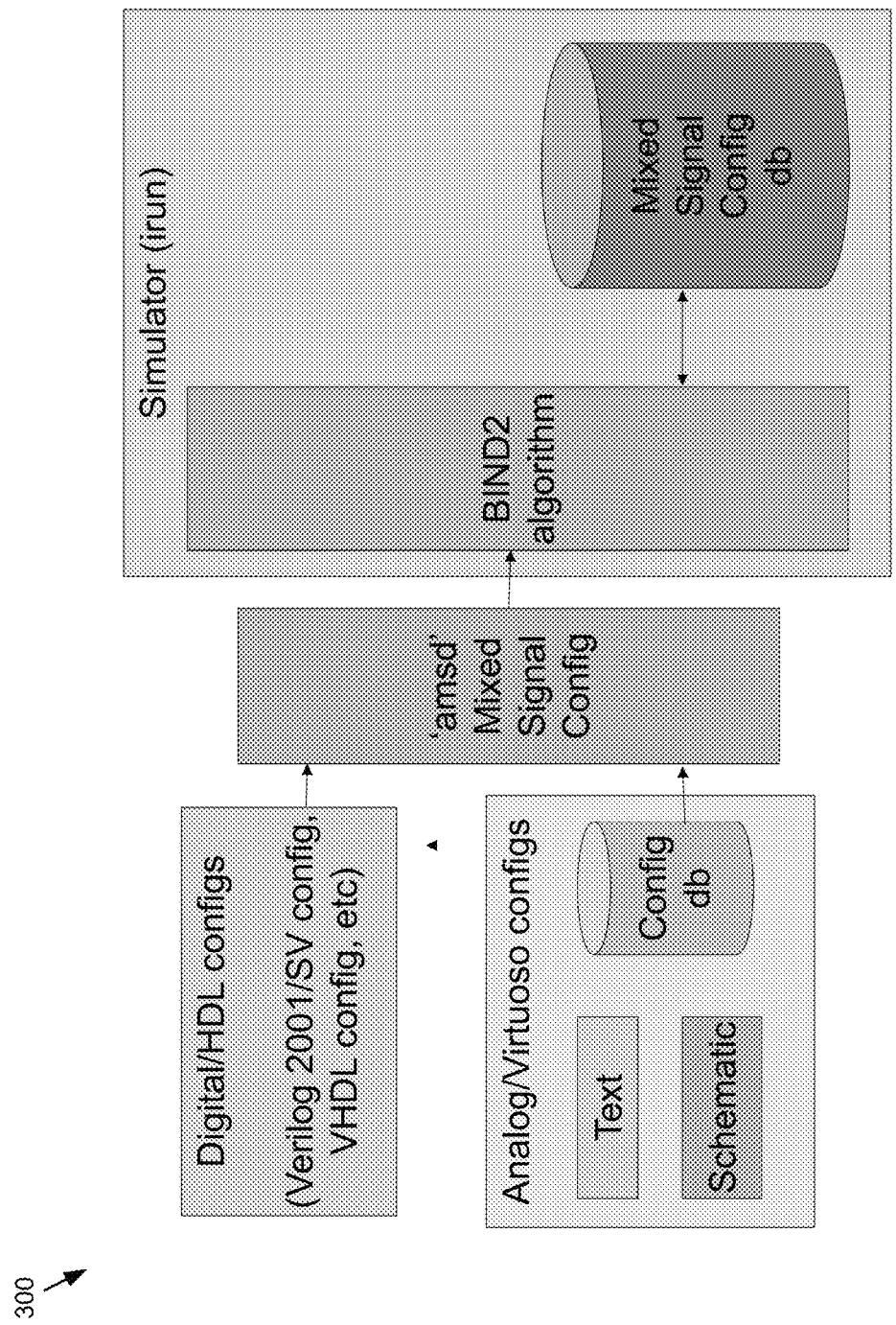
FIG. 3 is a diagram depicting aspects of the configuration reuse process in accordance with an embodiment of the present disclosure.

Referring now to FIG. 3, an embodiment consistent with configuration reuse process 10 is provided. Mixed signal configurations (e.g., 'amsd' block) were extended to integrate the specification in various EDA application configurations with those in digital/HDL configurations. Previously, users had been faced with a number of challenges. Some of these included, but were not limited to, manual or limited script based post processing of the amsd block leading to bugs (e.g., maintenance overhead), recurring cost every time the design/IP (e.g., source) changes, recurring cost every time the larger design (e.g., target) changes the location of that source IP in that target design, debugging problems due to the changes introduced via post processing from source to target, proprietary intermediate files are system files and subject to change. It is too risky for users to scale any of the above approaches based on a system file that can change over time.

As used herein, the "amsd block" may refer to a block/set of rules used to specify information that may be used to construct/assemble an AMS (i.e., Analog-Mixed-Signal or Mixed Signal in general) design. This may include, but is not limited to, information regarding instances, ports, interface elements, etc., all at the analog/digital boundary.

As used herein, reference to "BIND2" may refer to a Mixed Signal Binding engine/algorithm that takes inputs from above mixed signal block and works with other pure digital binding/configuration engines and/or analog mixed signal configuration, available from applications of the Assignee of the present disclosure, to assemble the mixed signal design, within certain constraints, for simulation/verification.

Figure 4:
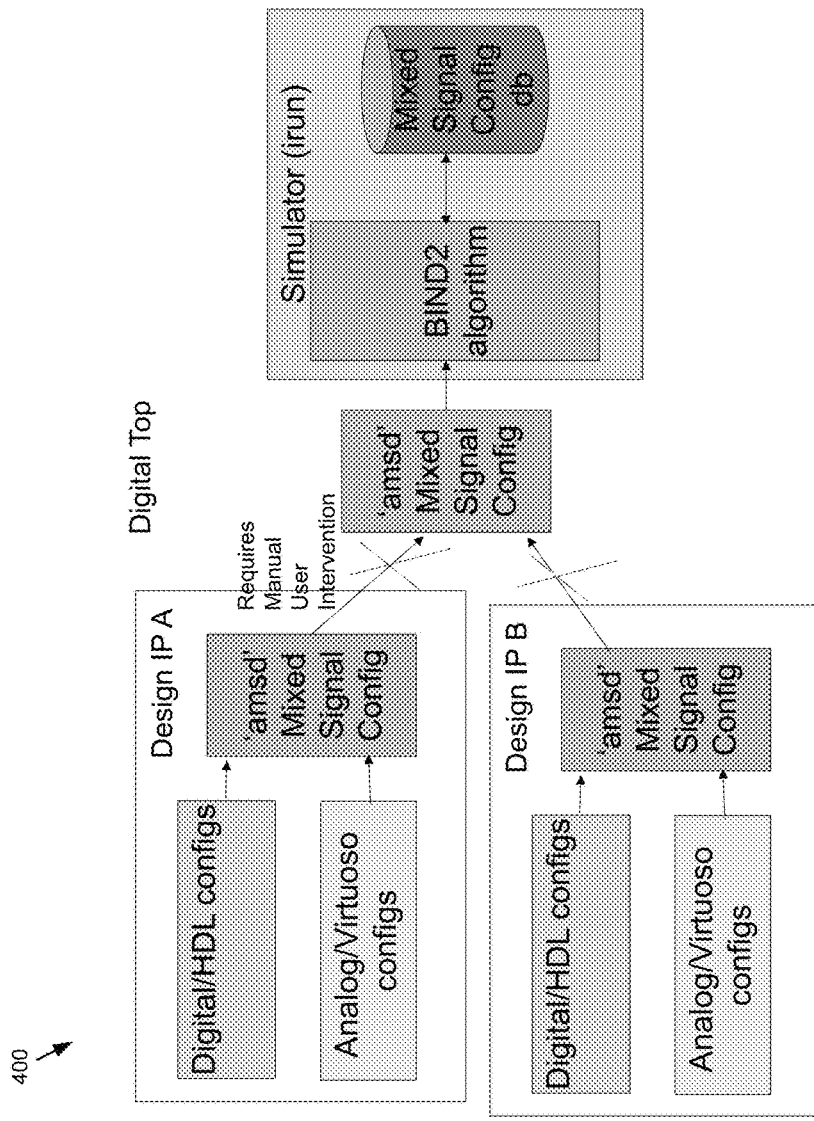
FIG. 4 is a diagram depicting aspects of the configuration reuse process in accordance with an embodiment of the present disclosure.
Figure 5:
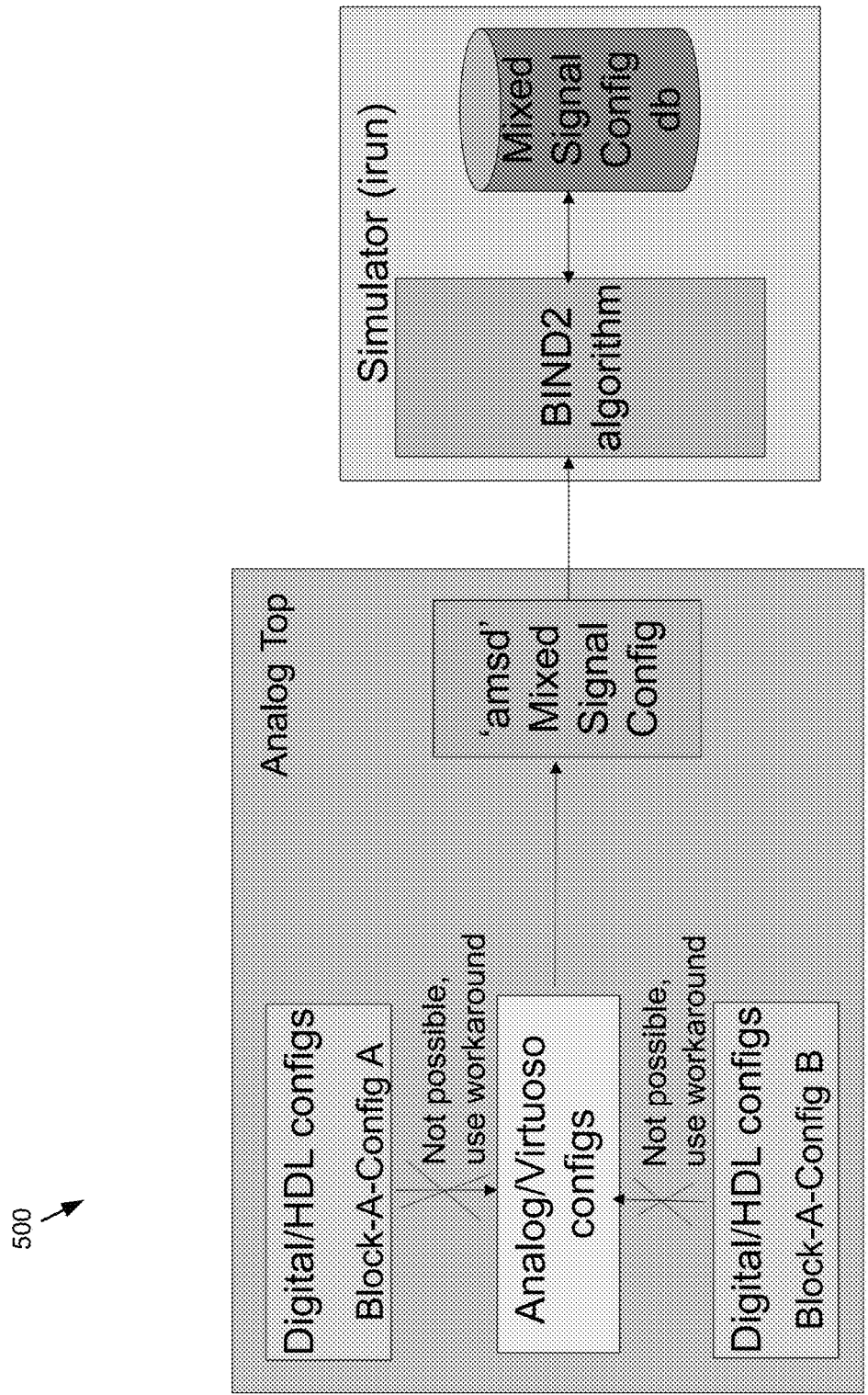
FIG. 5 is a diagram depicting aspects of the configuration reuse process in accordance with an embodiment of the present disclosure.

Referring also to FIGS. 4-5, examples depicting the challenges of reusing mixed signal configurations with a digital-on-top (DoT) Flow (see FIG. 4) and an analog-on-top (AoT) Flow (see FIG. 5) are shown. As depicted in the Figures each of these examples require either tedious manual intervention or are not possible.

The term "AoT", as used herein, may refer to an Analog-on-top flow or solution which is predominantly based on an Analog platform, such as those available from the Assignee of the present disclosure, or other analog centric simulators. The term "DoT" refers to a Digital-on-top flow or solution which is predominantly in a command-line environment, such as those available from the Assignee of the present disclosure, or other digital centric simulators.

In existing approaches, customers design and verify their analog and mixed signal blocks in an EDA application often using a mixed signal netlisting solution that provides a truly integrated solution for netlisting a design. This may be configured to use both text and schematic/analog views while not necessarily importing text into an analog design environment/platform such as Design Framework II (DFII) available from the Assignee of the present disclosure.

Once customers verify such a design and create that IP, they may hope to reuse that IP as-is. For example, the customer may want to integrate their IP block into a top-level SystemVerilog HDL block which may be configured using a Verilog 2001 configuration. In other words, the Virtuoso IP block which had its own top-level may need to be integrated into a higher level V2001 config top ("super-top"). The customer may also want to run this top-level SV block, which includes the Virtuoso IP block from the command-line.

As used herein, the phrase "top-level" may refer to the top-level unit in a design. This can be a top level in AoT or DoT flow. The phrase "super-top" as used herein, may refer to a top-level unit in a design which also includes another block which was simulated separately as a top-level unit (e.g., IP block) in AoT or DoT flow. After such a separate verification of an IP block, there may be a need for reusing that IP in a larger block (of which it will be a part of). Such a larger block with a new top-level may be referred to as a super-top. For example, reusing an AoT top level as a sub instance in a new DoT run or vice-versa. In this case the top level in the new run may be referred to as a super-top.

To achieve the above use model in today's solution, customer has to manually manage the intermediate binding file generated by the mixed signal netlisting solution and ensure that the paths and names used in that intermediate file match the hierarchical paths that will be created when the IP block is integrated into the top-level V2001 configuration. Every time the UNL netlist is generated, the user must go through the above manual process. Similarly, every time the location of the IP block may change in the top-level SoC, the user must also perform the above manual process. The intermediate binding file may be a tool-generated intermediate file that is subject to change anytime by the software provider, which causes further problems. To eliminate the challenges described above, embodiments of configuration reuse process 10 may integrate the netlist generated by the mixed signal netlisting solution (for the IP block) with a Verilog 2001 configuration using some user-friendly rules.

In another variation of the above general IP reuse requirement, analog-centric users may want to refer to different configurations or views of the same digital text block (e.g., those maintained outside the EDA application as a black box design unit) from within Virtuoso UNL's configuration. In existing approaches, such a use model is not supported. As such, users have to manually rename their digital texts to be unique so that they may be integrated into the EDA application's analog design. Any such renaming of blocks brings standard challenges associated with renaming, for example, maintenance/consistency between the digital version and its counterpart in the EDA application, user-errors during hand-off, etc. Specific examples of these issues are provided below.

For a digital centric engineer, if he/she wants to integrate several UNL IP's as one or more sub-blocks, they need to manually change UNL designtop of binding configuration file to be the same the irun top, also correlate hierarchy instance path to be begin with current top irun.

Figure 6:
FIG. 6 is a diagram depicting aspects of the configuration reuse process in accordance with an embodiment of the present disclosure.
Figure 6:
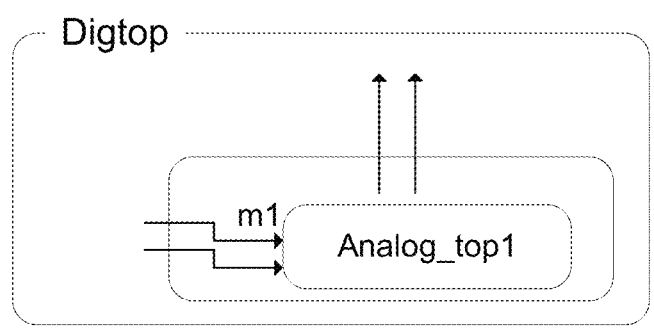

//Virtuoso "analog_top1" Bind2 configuration
amsd {
   config designtop="lib1. analog_top1:schematic"
   config   inst="analog_top1.I22"   lib="DEMO"
     view=schematic
   config cell="DIG" view=analogtext
   config inst="analog_top1.I11.I2" view="digitaltext"
   parent="DEMO.ANA:schematic"
}
//end amsd Referring also to FIG. 6, the user may want to integrate instance "xanalog_top1" of design unit "analog_top1" into digital super top "Digtop". User may need to change the Bind2 configuration as:
amsd {
   config designtop="worklib.Digtop:Verilog"
   config         inst="Digtop.m1.xanalog_top1.I22"
     lib="DEMO"
  view=schematic
   config cell="DIG" view=analogtext
   config         inst="Digtop.m1.xanalog_top1.I11.I2"
     view="digitaltext"
   parent="DEMO.ANA:schematic"
}

Figure 7:
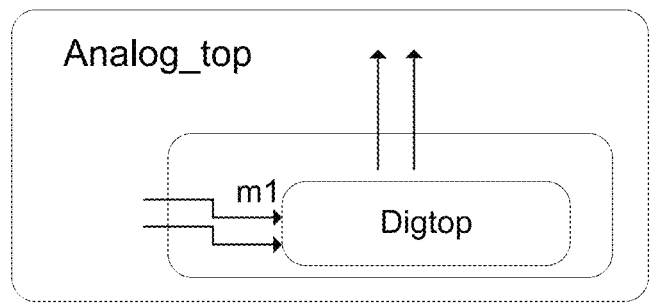
FIG. 7 is a diagram depicting aspects of the configuration reuse process in accordance with an embodiment of the present disclosure.

Additionally and/or alternatively, if an analog centric user wants to integrate digital IP with Verilog 2001 configuration into a particular EDA application design, it still may not work using existing approaches. Since Verilog 2001 configurations support hierarchical configurations, embodiments of the present disclosure may leverage that approach for this requirement. Accordingly, a user may need to create a top level Verilog 2001 configuration and then refer to the sub level digital IP as an hierarchical configuration:

```
//Verilog 2001 configuration
config myconfig;
   design worklib.Digtop;
   default liblist worklib;
   instance top.i1 use worklib.inv:wreal;
endconfig
// end Verilog 2001
```
Referring also to FIG. 7, the user may want to integrate digtop into virtuoso top design "analog_top" at "Analog_top.m1". The user may need to manually create a top level V2001 configuration:

```
Config topconfig;
design worklib.Analog_top;
instance Analog_top.m1.xdigtop use myconfig:config;
endconfig
```

Accordingly, embodiments of configuration reuse process 10 may integrate different views/configurations of the same digital text IP within an EDA application design/configuration. With respect to the particular example identified above, embodiments of the present disclosure may allow for integration between a digital top using Verilog 2001 configuration (e.g., technology used by digital centric user) and the EDA application's analog design top, which may be managed via UNL's proprietary/intermediate (e.g., Bind2) configuration (e.g., technology used by analog centric user).

Accordingly, embodiments of configuration reuse process 10 may enable a mixed signal configuration (e.g., via the amsd block) to be able to reuse and reference either digital/HDL configurations (e.g., Verilog 2001/SystemVerilog configurations) or analog (e.g. those available from the Assignee of the subject application) configurations as a part of mixed signal configuration specification. Additionally and/or alternatively, embodiments of configuration reuse process 10 may enable mixed signal configurations to be able to reference other mixed signal configurations by using a label, which is discussed below in further detail. Embodiments of configuration reuse process 10 may also enable a DoT user to directly use and/or reference the original mixed signal configuration for a design IP block as-is and may simulate one or more such blocks in a larger design/SoC. Embodiments of configuration reuse process 10 may also enables an AoT user to directly use and/or reference the original digital/HDL configuration (e.g., Verilog/SystemVerilog, etc.) for a design IP block as-is and may simulate one or more such blocks in a larger design/SoC. Embodiments of configuration reuse process 10 may also enable an AoT user to directly use and/or reference the original digital/HDL configuration (e.g., Verilog/SystemVerilog, etc.) as the top-level ('supertop') design or testbench to simulate a design created in a particular environment (e.g., those available from the Assignee of the subject application, etc.). Embodiments of configuration reuse process 10 may also enable an AoT user to configure different instances of the same digital 'blackbox' cell and/or block in a particular EDA application (e.g., those available from the Assignee of the subject application, etc.) to different digital models and/or configurations of that same digital cell, design, and/or block and simulate them as a part of a single top level design.

In some embodiments, and to eliminate the challenges described above, embodiments of configuration reuse process 10 may integrate the netlist generated by Virtuoso UNL (for the IP block) with a Verilog 2001 configuration. Some examples of use models are described below in further detail.

In some embodiments, configuration reuse process 10 may allow for an IP block's reuse in a digital command-line flow. In this use model, a digital top with a Verilog 2001 configuration will be able to reference an IP block which may be pre-verified using Virtuoso's UNL technology. For example, consider the following use case. Here, the digital top is 'worklib.digtop' and the pre-verified IP block from the EDA application is 'analog_top1' (e.g., 'analog_top1' is the IP block's top-level unit that was netlisted and verified in the EDA application). To integrate the EDA application's IP block into the digital top using V2001 configuration, embodiments of configuration reuse process 10 may enable references to UNL's configuration using some new specifiers (highlighted in italics below):

```
// V2001 config for the digital top—libconfig.v
config myconfig;
design worklib.digtop;
default liblist worklib;
instance top.i1 use worklib.inv:wreal;
instance top.i2 usecds amsconfiglib.analog_top1:amsconfig2;
cell analog_top2 usecds amsconfiglib.analog_top2:amsconfig;
endconfig
// Virtuoso UNL's proprietary/intermediate configuration
   file—by default, it will have a label of 'amsconfig'
amsd{
   config       designtop="lib1.analog_top1:schematic"
      label=amsconfig2
   config cell="ANA" lib="DEMO" view=schematic
   config cell="DIG" view=digitaltext
   config inst="mytop.I11.I2" view="digitaltext"
      parent="DEMO.ANA:schematic"
   }
```

In some embodiments, configuration reuse process 10 may allow for the creation of the following new semantics for specifying configurations. In the EDA application's UNL's proprietary/intermediate (e.g., Bind2) configuration file, a new semantic called a 'label' may be defined. The user may specify a custom label name for such a configuration using the EDA application's ADE user interface as a step to prepare that IP for reuse. A default label of amsconfig' may be tagged to that configuration, if the user has no user-defined label for that configuration. In the example above, the "label=amsconfig2" may be created to uniquely identify the EDA application's analog design configuration.

In Verilog 2001's configuration specification, in the 'use' clause, we define two new specifiers. The specifier 'cds_amsconfiglib', when used in the library specification field, may indicate that the configuration specified is referring to the EDA application's UNL's proprietary/intermediate configuration. The specifier 'label', when used in the view specification field, may indicate that the configuration specified is referring to a specific type of Virtuoso UNL's proprietary/intermediate configuration.

In the example above, "cds_amsconfiglib.analog_top1:amsconfig2" is a virtual Verilog config name which is used as an interface between two different designs. For example, "cds_amsconfiglib" may refer to an identification for the EDA application's proprietary/intermediate (e.g., Bind2) configuration, "analog_top1" is the analog design top, and "amsconfig2" is a default bind2 configuration label.

Given the above new semantics, in the example above for the V2001 configuration, the last two statements referring to instance "top.i2" and cell "analog_top2" specify the semantics to associate those IP blocks to their corresponding configurations defined via the EDA application's UNL's proprietary/intermediate configuration files. With such an association, the binding rules for those IP blocks may be processed according to the rules specified in Virtuoso UNL's proprietary/intermediate (e.g., Bind2) file.

In some embodiments, digital sub-top's reuse within an EDA application's UNL flow (e.g., where different instances of the same digital block maintained outside the EDA application as a black box design unit) may be configured to point to different V2001 configurations within the same EDA application top-level configuration. In this use model, the EDA application UNL design may be able to integrate digital sub-top blocks using their existing Verilog 2001 configuration. For example, let's consider the following use case. In this example, the EDA application's UNL's top-level configuration is referring to 'lib1.analog_top:schematic'. And the analog design in the EDA application has two instances 'analog_top1.I11.I22' and 'analog_top1.I11.I22' of the same digital cell 'digIP_foo'. In this particular example, 'digIP_foo' has been verified in a purely digital flow using two different V2001 configurations (e.g., 'worklib.myconfig:config' and 'worklib.myconfig2:config').

To integrate the digital IP blocks within the analog design in the EDA application, embodiments of configuration reuse process 10 may use some new specifiers (highlighted in italics below):

//Bind2 file
amsd{
config designtop="lib1. analog_top:schematic"
config cell="ANA" lib="DEMO" view=schematic
config cell="DIG" view=digitaltext
config inst="analog_top1.I11.I2" view=digitaltext
digitaltext "worklib.myconfig:config"
parent="DEMO.ANA:schematic"
config inst="analog_top1.I11.I22" view=digitaltext
digitaltext "worklib.myconfig2:config"
parent="DEMO.ANA:schematic"
}

In some embodiments, configuration reuse process 10 may allow for the creation of the following new semantics for specifying such configurations. For example, the ability to configure a black box design unit (e.g., digital text block maintained outside the EDA application) to a specific configuration using a new modifier called 'digitaltext' Embodiments also include the ability to specify the new 'digitaltext' modifier for both the 'cell' and 'instance' based configurations in the EDA application's UNL's proprietary/intermediate configuration file.

In the example above, "worklib.myconfig:config' and "worklib.myconfig2:config" may be standard Verilog 2001 configuration formats. The last two "config" statements will make those instances "analog_top1.I11.I2" and "analog_top1.I11.I22" to be bound to their respective hierarchical Verilog 2001 configurations. Binding rules in those V2001 configurations may then control.

In some embodiments, for the digital on top flow, a user may directly refer to a Virtual Verilog 2001 config identification as "cds_amsconfiglib.analog_top1:amsconfig2" to integrate it into a digital command line verification flow. Additionally and/or alternatively, for an analog on top flow, a user may directly refer to a real standard digital Verilog 2001 configuration to integrate it into the EDA application's UNL's proprietary/intermediate configuration format.

Embodiments of the configuration reuse process 10 described herein may provide new semantics to cross reference multiple V2001 configs within an EDA application configuration and vice-versa. As such, the teachings of the present disclosure may enable two different verification group engineers (e.g., one analog centric and the other digital centric) to cross reference their designs with their configurations as-is. The new semantics are user-friendly and try to mimic the user's preferred specification environment (e.g., they can directly call each other's configuration specification) without the need to know the detailed information about each other's design or configuration. This information may include, but is not limited to, their hierarchical paths, location of configurations, etc.

Embodiments of the configuration reuse process 10 described herein may provide a number of advantages over existing technologies. Some of these may include, but are not limited to, enabling IP Reuse "as-is" with minimal user-friendly specification. Users do not need to do any manual integration or write some scripts to align sub-top to be the same as the super-top (e.g., the overhead associated with maintaining such intermediate steps is eliminated completely). Embodiments disclosed herein may also enable heterogeneous hierarchical configuration across digital and analog user environments. This greatly helps users to continue working in their preferred (e.g., analog or digital) environments while cross-referencing each other's IP blocks and their configurations as if they were created in their preferred environment.

Figure 8:
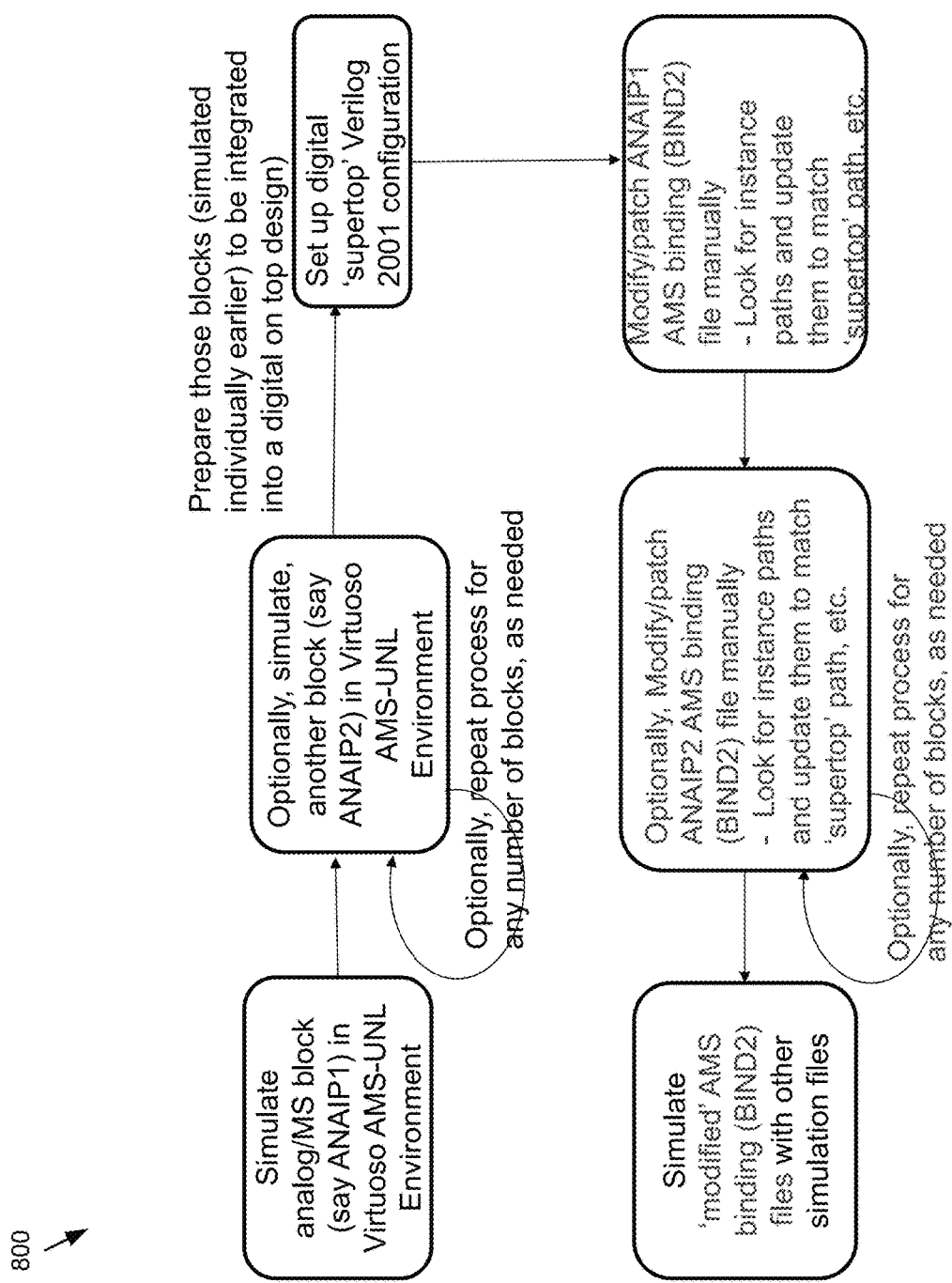
FIG. 8 is a diagram depicting aspects of the configuration reuse process in accordance with an embodiment of the present disclosure.
Figure 9:
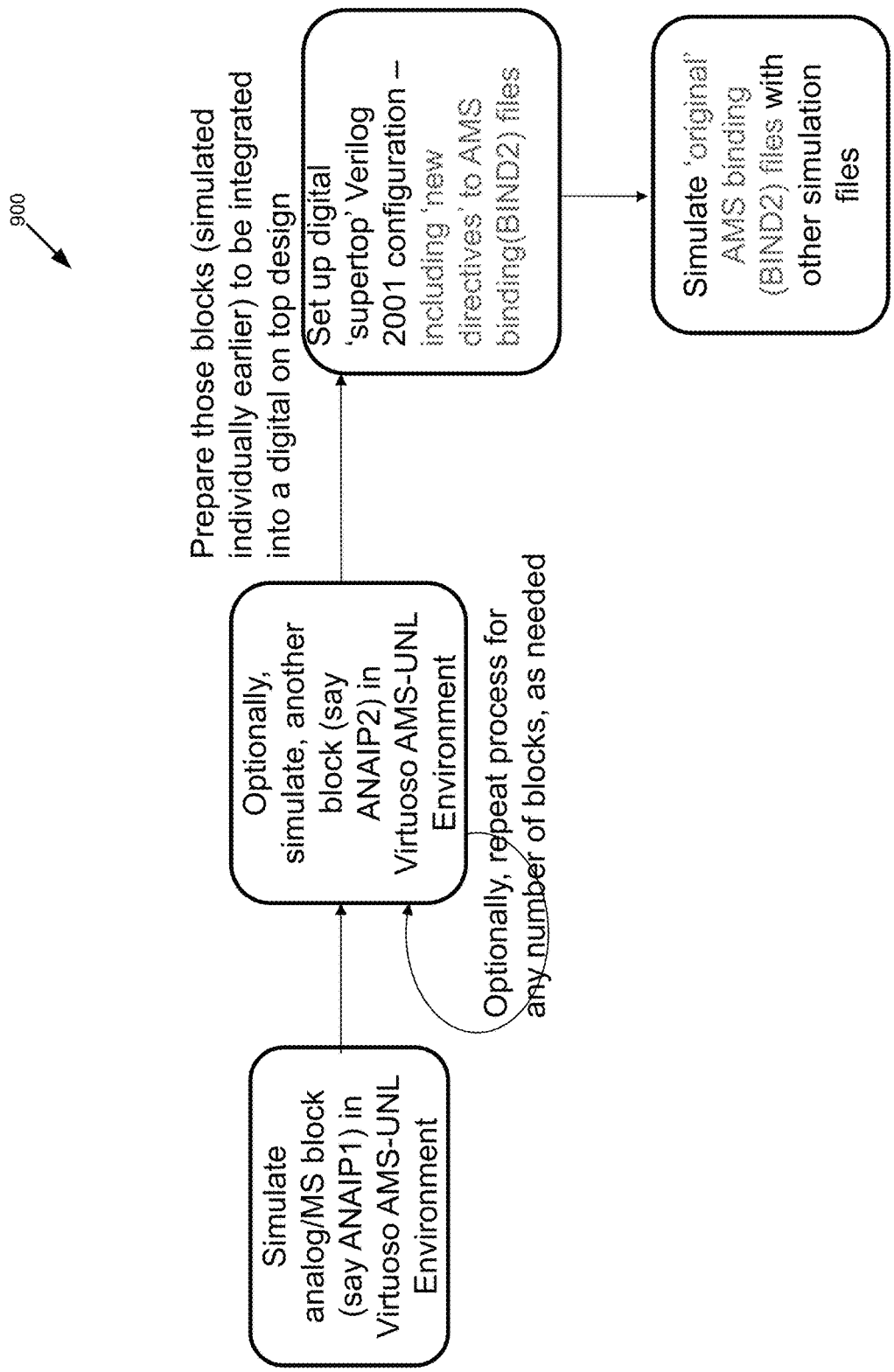
FIG. 9 is a diagram depicting aspects of the configuration reuse process in accordance with an embodiment of the present disclosure.
Figure 10:
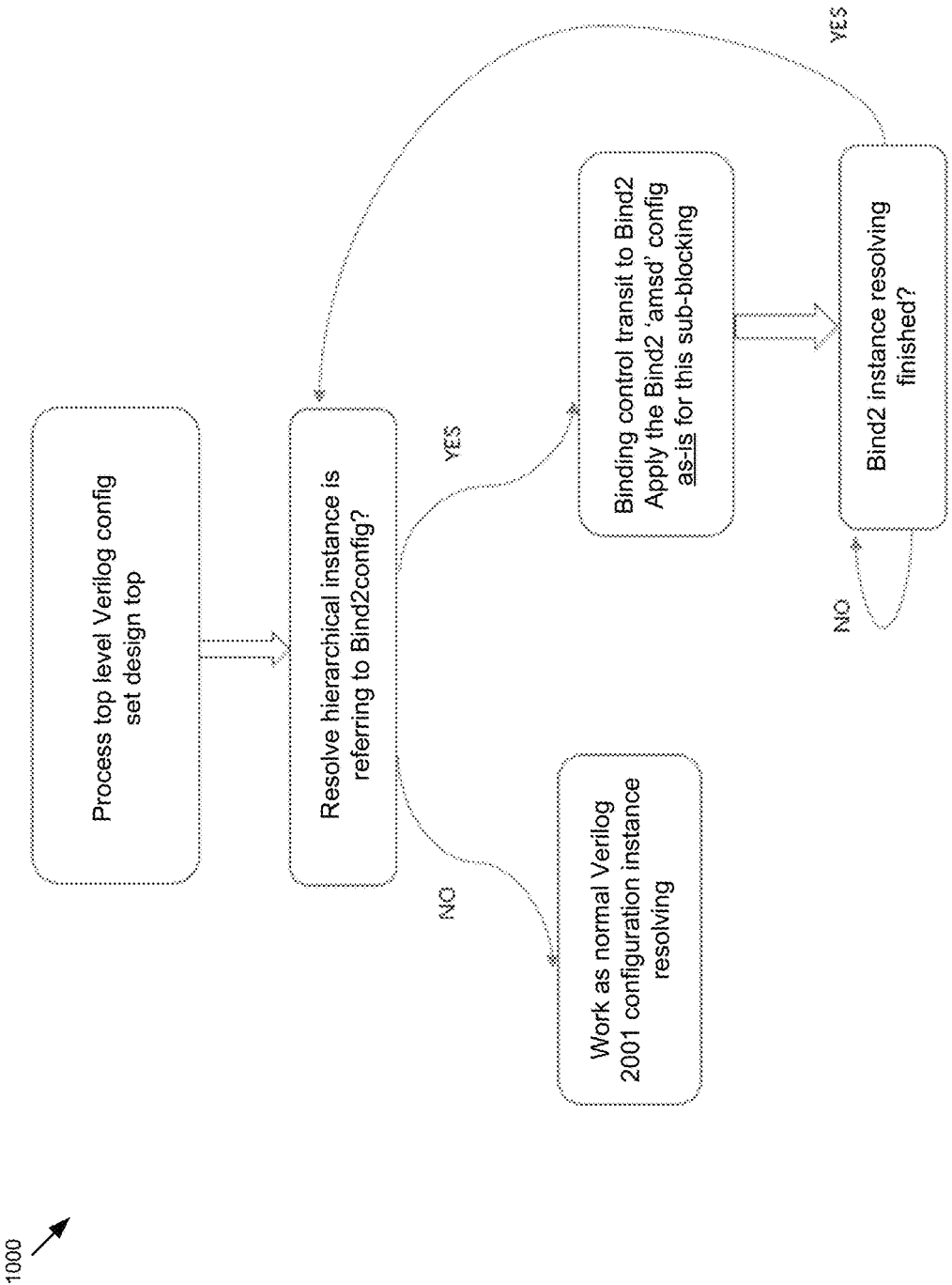
FIG. 10 is a diagram depicting aspects of the configuration reuse process in accordance with an embodiment of the present disclosure.

Referring now to FIG. 8, a flowchart 800 depicting some of the challenges inherent in the existing digital on top flow is provided. FIG. 9 depicts an embodiment of a flowchart 900 consistent with the teachings of configuration reuse process 10. FIG. 10 depicts another embodiment of a flowchart 1000 showing an AoT example detailed binding algorithm consistent with the teachings of configuration reuse process 10.

Figure 11:
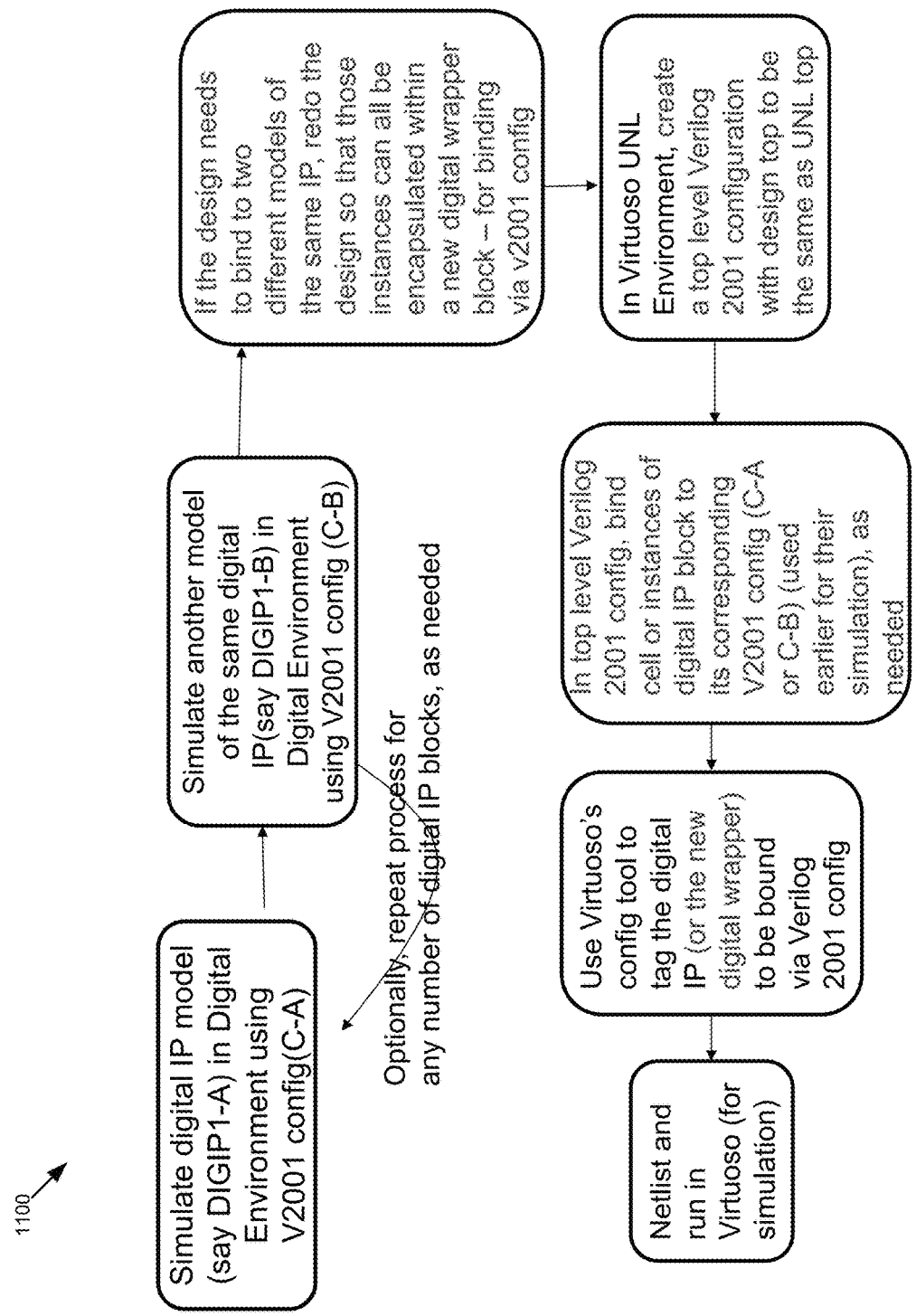
FIG. 11 is a diagram depicting aspects of the configuration reuse process in accordance with an embodiment of the present disclosure.
Figure 12:
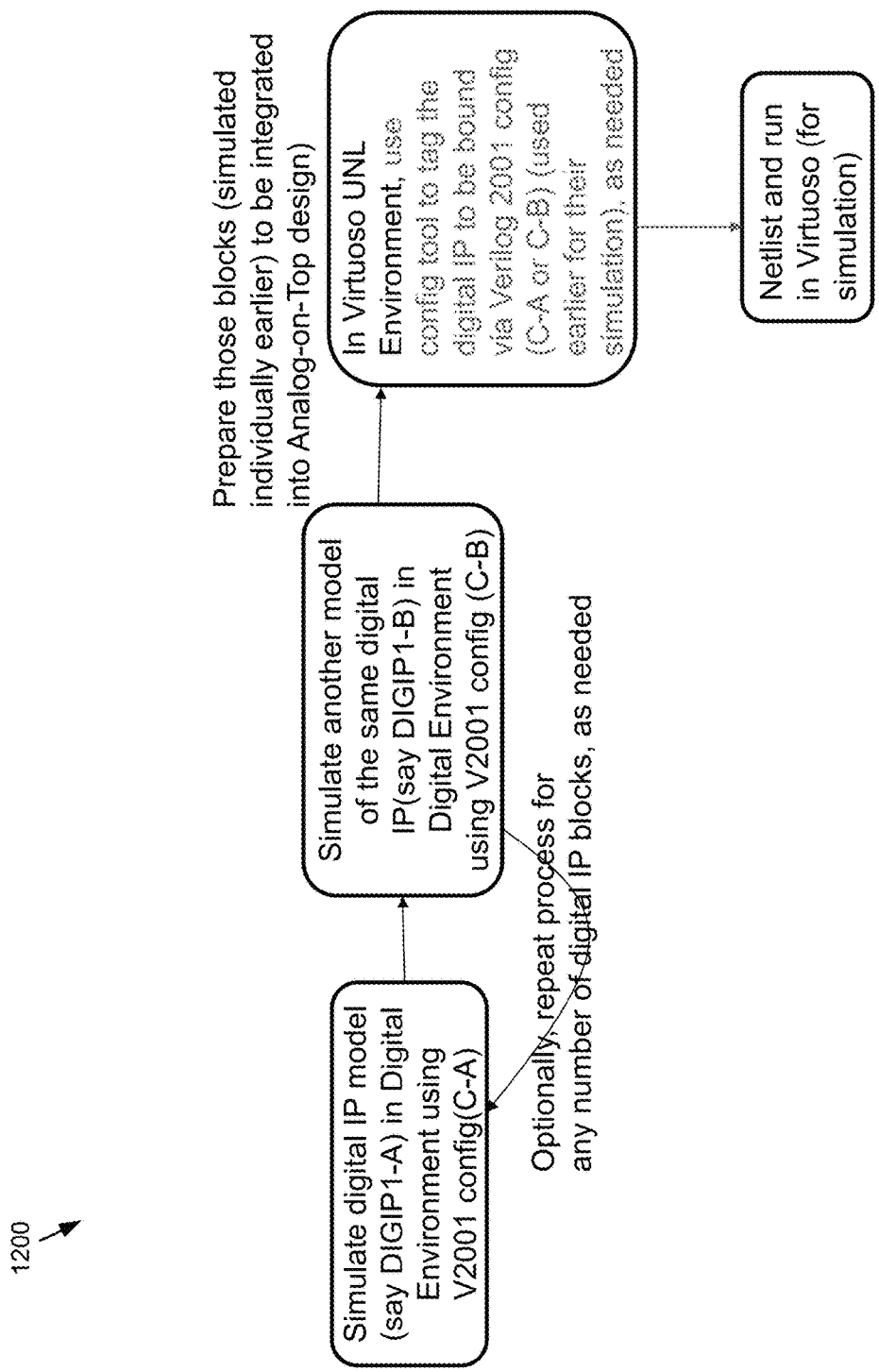
FIG. 12 is a diagram depicting aspects of the configuration reuse process in accordance with an embodiment of the present disclosure.
Figure 13:
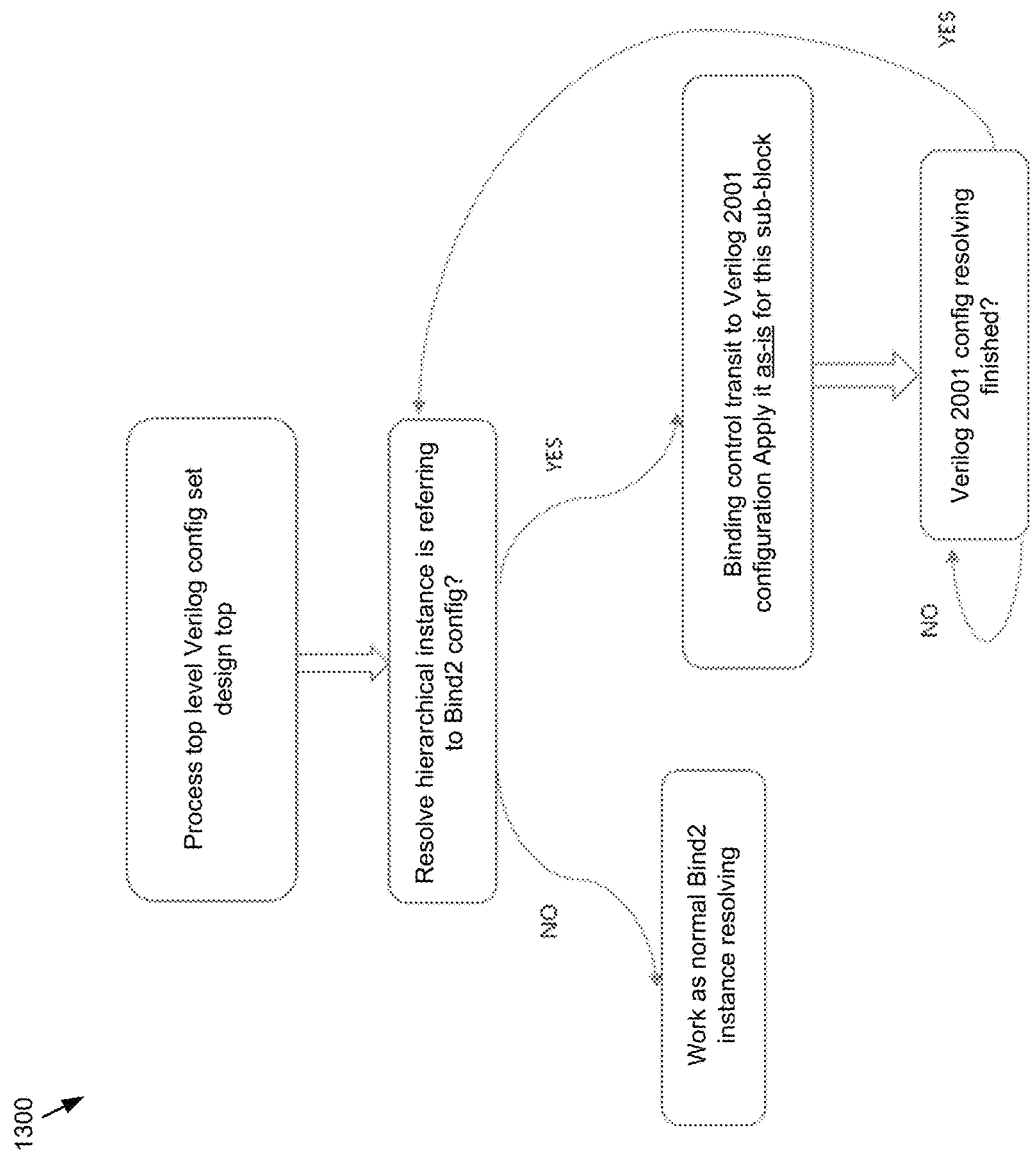
FIG. 13 is a diagram depicting aspects of the configuration reuse process in accordance with an embodiment of the present disclosure.

Referring now to FIG. 11, a flowchart 1100 depicting some of the challenges inherent in the existing analog on top flow is provided. FIG. 12 depicts an embodiment of a flowchart 1200 consistent with the teachings of configuration reuse process 10. FIG. 13 depicts another embodiment of a flowchart 1300 showing a DoT example detailed binding algorithm consistent with the teachings of configuration reuse process 10.

It should be noted that designers or design managers may apply a configuration in a variety of different ways. Some of these may include, but are not limited to, applying a configuration to an entire system, to an entire project, to a sub design in a project, and/or to a design object in a system or a project. Additionally and/or alternatively, configuration reuse process 10 may allow a user to apply multiple configurations over time of a project. In some embodiments, the same configuration may be applied over time, which may result in the configuration moving from earlier objects to new objects.

In some embodiments, configuration reuse process 10 may maintain the integrity for the design and the relationships to the various objects. When users apply the configuration to a design, the sub design elements may be automatically chosen on the configuration. If the configuration is applied only to a sub-design, the high level design that uses the sub-design elements are not chosen automatically. When multiple design objects are chosen for applying a configuration and if they share any common object, it may be selected by configuration reuse process 10. The user may choose to add other optional elements into the configuration as well.

In some embodiments, EDA application 20 and/or configuration reuse process 10 may support a variety of languages and/or standards. EDA application 20 may support one or more software extensions and may be used in conjunction with one or more EDA tools such as those available from the Assignee of the subject application.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method comprising:
   providing, using at least one processor, an electronic design to be fabricated having one or more mixed signal configurations, wherein a configuration refers to a set of rules that specify how the electronic design is constructed for a simulation;
   storing at least one digital configuration and at least one analog configuration at an electronic design database;
   allowing the one or more mixed signal configurations with an option to access either the at least one digital configuration or the at least one analog configuration from the electronic design database;
   receiving, via the at least one processor, a user-generated label; and
   applying the user-generated label to the one or more mixed signal configurations.

2. The computer-implemented method of claim 1, wherein the at least one digital configuration includes one or more of a Verilog configuration, VHDL configuration, and a SystemVerilog configuration.

3. The computer-implemented method of claim 1 further comprising:
   providing a digital-on-top user with access to the one or more mixed signal configurations; and
   allowing a simulation using the one or more mixed signal configurations.

4. The computer-implemented method of claim 1 further comprising:
   providing an analog-on-top user with access to the at least one digital configuration; and
   allowing a simulation using the at least one digital configuration.

5. The computer-implemented method of claim 1, wherein the at least one digital configuration is used as a top-level design or testbench.

6. The computer-implemented method claim 1 further comprising:
   allowing an analog-on-top user to configure a plurality of different instances of a digital cell or block to a different digital configuration within the electronic design.

7. A non-transitory computer-readable storage medium having stored thereon instructions that when executed by a machine result in the following operations:
   providing, using at least one processor, an electronic design to be fabricated having one or more mixed signal configurations, wherein a configuration refers to a set of rules that specify how the electronic design is constructed for a simulation;
   storing at least one digital configuration and at least one analog configuration at an electronic design database;
   allowing the one or more mixed signal configurations with an option to access either the at least one digital configuration or the at least one analog configuration from the electronic design database;
   receiving, via the at least one processor, a user-generated label; and
   applying the user-generated label to the one or more mixed signal configurations.

8. The computer-readable storage medium of claim 7, wherein the at least one digital configuration includes one or more of a Verilog configuration, VHDL configuration, and a SystemVerilog configuration.

9. The computer-readable storage medium of claim 7 further comprising:
   providing a digital-on-top user with access to the one or more mixed signal configurations; and
   allowing a simulation using the one or more mixed signal configurations.

10. The computer-readable storage medium of claim 7 further comprising:
    providing an analog-on-top user with access to the at least one digital configuration; and
    allowing a simulation using the at least one digital configuration.

11. The computer-readable storage medium of claim 7, wherein the at least one digital configuration is used as a top-level design or testbench.

12. The computer-readable storage medium of claim 7 further comprising:
    allowing an analog-on-top user to configure a plurality of different instances of a digital cell or block to a different digital configuration within the electronic design.

13. A system comprising:
    a computing device having at least one processor configured to receive an electronic design to be fabricated having one or more mixed signal configurations, wherein a configuration refers to a set of rules that specify how the electronic design is constructed for a simulation, the computing device further configured to store at least one digital configuration and at least one analog configuration at an electronic design database, the at least one processor further configured to allow the one or more mixed signal configurations with an option to access either the at least one digital configuration or the at least one analog configuration from the electronic design database, the at least one processor further configured to receive a user-generated label and apply the user-generated label to the one or more mixed signal configurations.

14. The system of claim 13, wherein the at least one digital configuration includes one or more of a Verilog configuration, VHDL configuration, and a SystemVerilog configuration.

15. The system of claim 13, wherein the at least one processor is further configured to provide a digital-on-top user with access to the one or more mixed signal configurations and allow a simulation using the one or more mixed signal configurations.

16. The system of claim 13, wherein the at least one processor is further configured to provide an analog-on-top user with access to the at least one digital configuration and allow a simulation using the at least one digital configuration.

17. The system of claim 13, wherein the at least one digital configuration is used as a top-level design or test-bench.

* * * * *